(12) United States Patent
Vopat et al.

(10) Patent No.: US 12,185,451 B2
(45) Date of Patent: Dec. 31, 2024

(54) RESONATOR, LINEAR ACCELERATOR, AND ION IMPLANTER HAVING DIELECTRIC-FREE RESONATOR CHAMBER

(71) Applicant: Applied Materials, Inc., Santa Clara, CA (US)

(72) Inventors: Robert B. Vopat, Austin, TX (US); Charles T. Carlson, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 123 days.

(21) Appl. No.: 17/980,894

(22) Filed: Nov. 4, 2022

(65) Prior Publication Data

US 2024/0064888 A1 Feb. 22, 2024

Related U.S. Application Data

(60) Provisional application No. 63/398,642, filed on Aug. 17, 2022.

(51) Int. Cl.
*H05H 9/00* (2006.01)
*H01J 37/317* (2006.01)
*H05H 7/18* (2006.01)

(52) U.S. Cl.
CPC ........... *H05H 9/00* (2013.01); *H01J 37/3171* (2013.01); *H05H 7/18* (2013.01)

(58) Field of Classification Search
CPC .... H05H 9/00; H05H 7/18; H05H 7/22; H01J 37/3171; H01J 2237/0206; H01J 2237/0473

See application file for complete search history.

(56) References Cited

U.S. PATENT DOCUMENTS

| | | | |
|---|---|---|---|
| 2013/0155568 A1* | 6/2013 | Todorow | H01J 37/32642 279/128 |
| 2016/0322242 A1* | 11/2016 | Nguyen | H01J 37/321 |
| 2019/0088443 A1* | 3/2019 | Satoh | C23C 14/48 |
| 2020/0381216 A1* | 12/2020 | Cui | H01J 37/321 |
| 2023/0060486 A1* | 3/2023 | Lee | H05H 1/466 |
| 2023/0154729 A1* | 5/2023 | Na | H01J 37/32183 438/798 |

FOREIGN PATENT DOCUMENTS

WO WO-2021067160 A1 * 4/2021 ............. H01F 19/04

\* cited by examiner

*Primary Examiner* — Abdullah A Riyami
*Assistant Examiner* — Syed M Kaiser
(74) *Attorney, Agent, or Firm* — KDW FIRM PLLC

(57) ABSTRACT

An apparatus may include a resonator chamber, arranged in a vacuum enclosure; an RF electrode assembly, arranged within the vacuum enclosure; and a resonator coil, disposed within the resonator chamber, the resonator coil having a high voltage end, directly connected to at least one RF electrode of the RF electrode assembly.

20 Claims, 5 Drawing Sheets

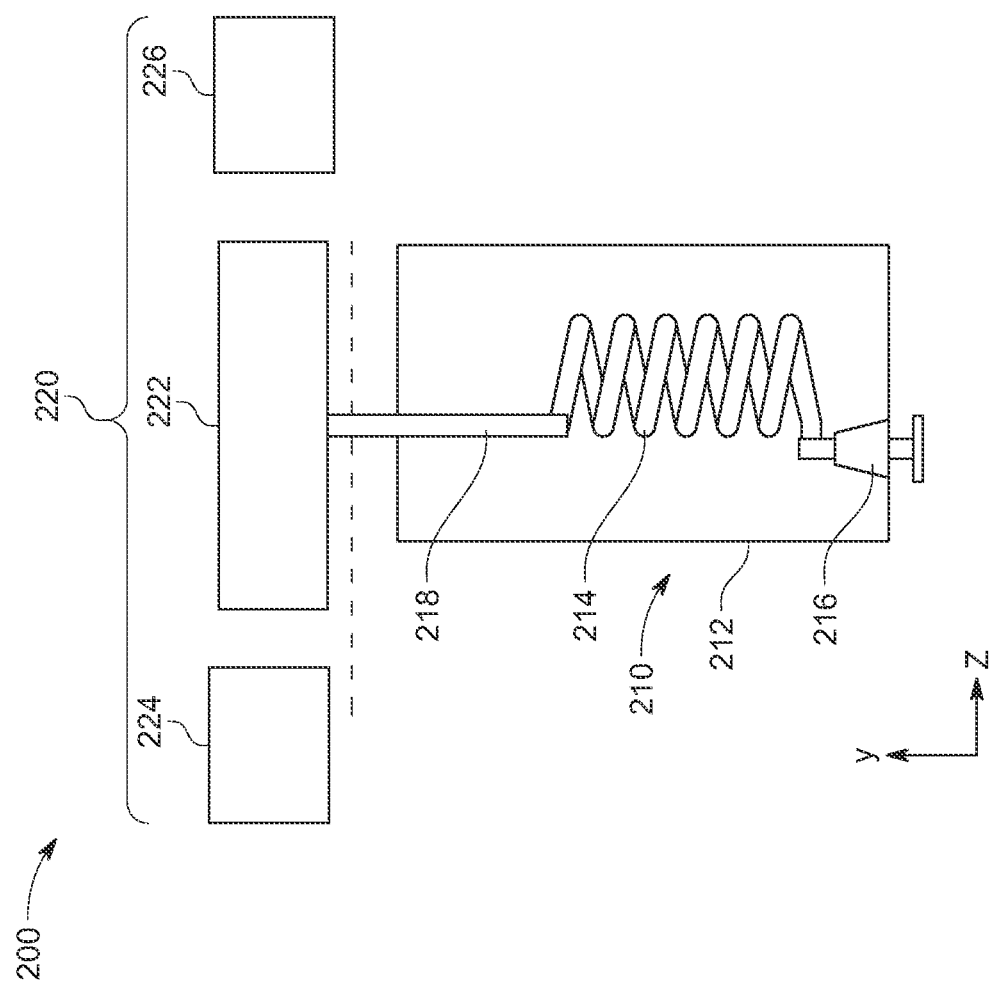

RESONATOR, LINEAR ACCELERATOR, AND ION IMPLANTER HAVING DIELECTRIC-FREE RESONATOR CHAMBER

CROSS-REFERENCE TO RELATED APPLICATION

This application claims priority to U.S. provisional patent application Ser. No. 63/398,642, filed Aug. 17, 2022, entitled "RESONATOR, LINEAR ACCELERATOR, AND ION IMPLANTER HAVING DIELECTRIC-FREE RESONATOR CHAMBER," and incorporated by reference herein in its entirety.

FIELD OF THE DISCLOSURE

The disclosure relates generally to ion implantation apparatus and more particularly to high energy beamline ion implanters based upon linear accelerators.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. One type of ion implanter suitable for generating ion beams of medium energy and high energy uses a linear accelerator, or LINAC, where a series of AC or RF electrodes arranged as tubes around the beam accelerate the ion beam to increasingly higher energy along the succession of tubes. The various electrodes may be arranged in a series of stages where a given electrode in a given stage receives an AC voltage signal to accelerate the ion beam.

As RF LINAC employs a high frequency drive signal to generate the high voltage at one or more electrodes in a given stage of the linear accelerator, via a resonator coil. An initial RF power signal may be provided to an RF exciter at a relatively lower voltage, such as several hundred volts. The voltage amplitude of this RF power signal is amplified though the resonator coil, which may output a high voltage to an RF electrode at voltages in the range of tens of keV. In particular, as the RF power signal is propagated through the resonator coil, the maximum amplitude of the voltage increases toward the coil ends that are proximate the RF electrodes.

Depending upon the exact configuration of one or more RF electrodes are arranged in each stage, the ion beam may be accelerated through two or three acceleration gaps within a given stage. In this manner, a given acceleration stage may accelerate the ion beam by up to several hundreds of keV.

In known RF LINAC designs, a resonator coil may be located at atmosphere, where the RF electrodes are located under vacuum. Insulators between the RF electrodes and ground may be placed outside of a beamline enclosure that houses the ion beam in these configurations.

An alternative approach to the known RF LINAC designs is to place the resonator coil in a resonator chamber that is located under vacuum and adjacent the RF electrodes. In this alternative approach an insulator structure is located within the resonator chamber and proximate the RF electrodes. The insulator structure provides mechanical support to the RF electrodes and serves to isolate the RF electrodes and resonator coil from ground. In this alternative approach, the high voltage end of a resonator coil is electrically coupled to the RF electrode via an electrical strap or similar electric wiring.

Because the RF voltage amplitude is relatively higher near the RF electrodes, a concern with the resonator design having a resonator coil under vacuum is the potential for dielectric breakdown and resultant failure in the insulator surfaces that are in contact with electrical conductors that support the high RF voltage, including the RF electrodes, the wiring, and the high voltage end of the resonator coil.

With respect to these and other considerations, the present disclosure is provided.

BRIEF SUMMARY

In one embodiment, an apparatus is provided. The apparatus may include a resonator chamber, arranged in a vacuum enclosure, as well as an RF electrode assembly, arranged within the vacuum enclosure. The apparatus may further include a resonator coil, disposed within the resonator chamber, where the resonator coil has a high voltage end, directly connected to at least one RF electrode of the RF electrode assembly.

In another embodiment, a linear accelerator may include a plurality of acceleration stages, wherein a give stage of the plurality of acceleration stages comprises: a resonator chamber, arranged in a vacuum enclosure, and an RF electrode assembly, arranged within the vacuum enclosure. The given stage may also include a resonator coil, disposed within the resonator chamber, the resonator coil having a distal end, directly connected to at least one RF electrode of the RF electrode assembly.

In a further embodiment, a ion implanter may include an ion source to generate an ion beam; and a linear accelerator, including at least one acceleration stage to accelerate the ion beam. At least one acceleration stage of the linear accelerator may include a vacuum enclosure, the vacuum enclosure housing an RF electrode assembly and a resonator coil, the resonator coil having a distal end, directly connected to at least one RF electrode of the RF electrode assembly.

BRIEF DESCRIPTION OF THE DRAWINGS

FIG. 4 depicts a side view another exemplary acceleration stage for a linear accelerator, according to embodiments of the disclosure.

Figure 1A:
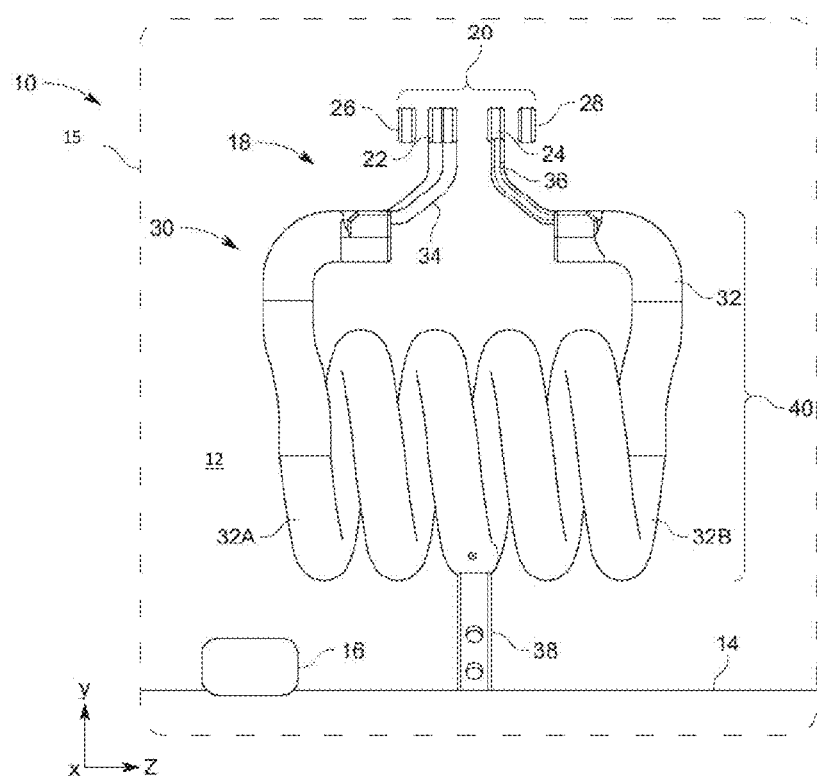
FIG. 1A shows a side view an exemplary acceleration stage for a linear accelerator, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved resonators for high energy linear accelerators control, and improved high energy ion implantation systems, based upon a beamline architecture. For brevity, an ion implantation system may also be referred to herein as an "ion implanter." Various embodiments provide novel configurations for providing the capability of generating high energy ions, where the final ion energy delivered to a substrate may be 300 keV, 500 keV, 1 MeV, 3 MeV, or greater. In exemplary embodiments, a novel resonator structure is disclosed, for high energy LINACs.

Figure 1B:
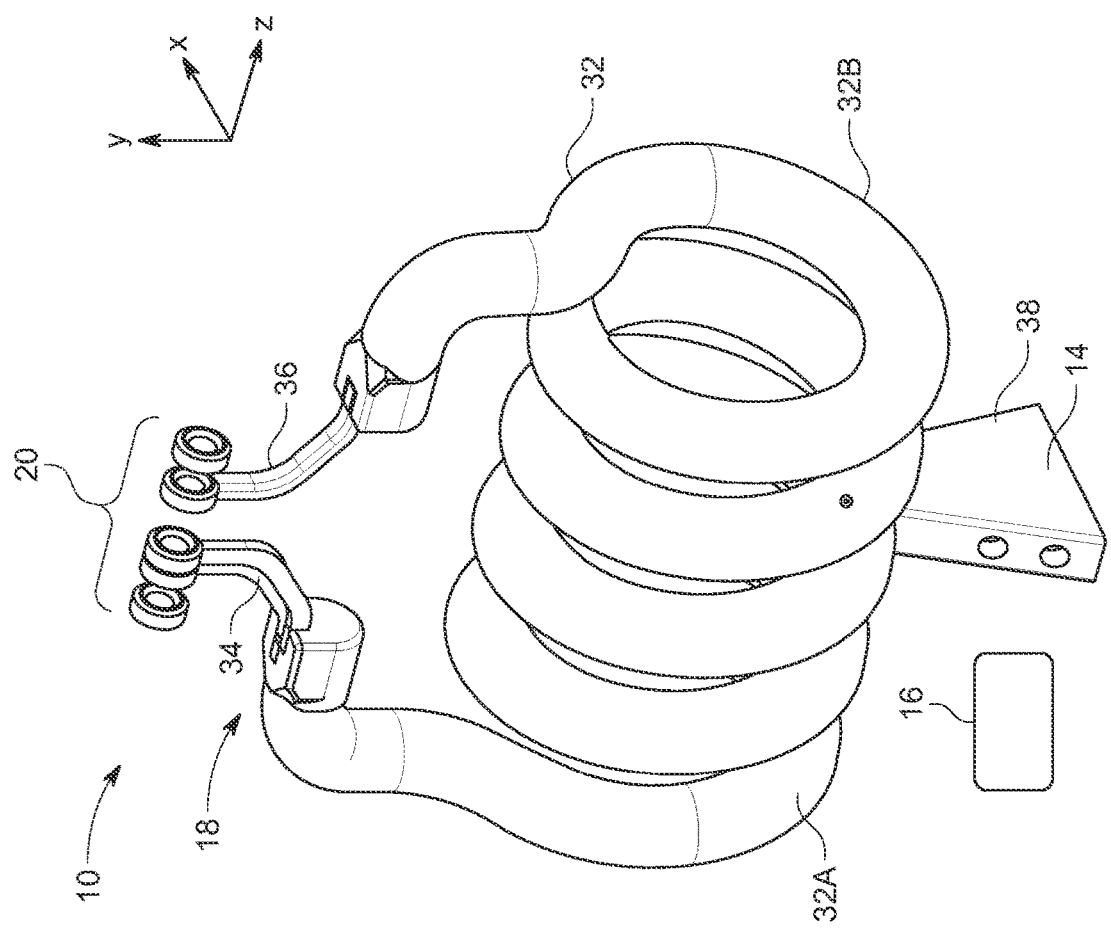
FIG. 1B illustrates an isometric view the exemplary acceleration stage of FIG. 1A.

FIG. 1A shows a side view an exemplary apparatus for a linear accelerator, according to embodiments of the disclosure, while FIG. 1B illustrates an isometric view the exemplary apparatus of FIG. 1A. In particular, an acceleration stage 10, as depicted in FIG. 1A, may be implemented in at least one stage of a linear accelerator. The acceleration stage 10 includes a resonator chamber 12, which chamber may be maintained under vacuum as a vacuum chamber in a vacuum enclosure 15 when used to accelerate an ion beam (not separately shown). The acceleration stage 10 includes a resonator 30, including a resonator coil 32 and a conductive base 38. In this embodiment, the resonator coil 32 includes a first coil 32A and a second coil 32B. Note that the resonator coil 32 is formed of conductive materials, in order to generate an oscillating voltage that is applied to an electrode assembly 20.

The electrode assembly 20 is arranged as a drift tube arrangement to conduct an ion beam therethrough, as known in the art. While an ion beam is conducted through the electrode assembly 20, the ion beam is accelerated according to the oscillating voltage is applied to the electrode assembly 20 by the resonator 30. In various embodiments, an electrode assembly may be arranged as a double, with a single powered electrode (see FIG. 4, below) or a triple gap drift tube assembly, with two powered electrodes, as depicted in FIG. 1A. The resonator 30 is disposed in the resonator chamber 12, to receive an RF power signal from an exciter 16. The resonator 30 may couple to the exciter 16 via a magnetic field, and may consequently generate an RF output signal at a frequency of the RF power signal. At a given upper terminal of the resonator coil 32, the RF output signal will be received as an RF voltage at a given RF electrode of the electrode assembly 20. A maximum amplitude of this voltage will depend upon the amplitude of the exciter 16 power. In the embodiment of FIG. 1A, a first terminal 34 of the first coil 32A is directly connected to a first RF electrode 22 of the electrode assembly 20, while a second terminal 36 of the second coil 32B is directly connected to a second RF electrode 24 of the electrode assembly 20.

Depending upon the amount of acceleration called for in a given ion implantation process, the voltage maximum developed at resonance condition for the resonator 30 may vary from say 1 kV to more several hundred kV, such as 200 kV, or 300 kV, according to non-limiting embodiments. In some examples, the exciter 16 may deliver an oscillating power signal at an amplitude of hundreds of volts, such as 500 V to 1000 V, according to some embodiments. This voltage is used to excite an RF voltage in the resonator 30, whose amplitude will vary from a ground end 14 to a high voltage end 18 of the resonator 30. As noted, the maximum amplitude of voltage at the high voltage end 18 may reach up to several hundred kV in accordance with embodiments of the disclosure. At resonance, the phase of the RV voltage at first RF electrode 22 may be 180 degrees different from the phase of the RF voltage at second RF electrode 24, such that, at maximum amplitude, the accelerating voltage between first RF electrode 22 and second RF electrode 24 may be twice the maximum amplitude of the RF voltage delivered by the resonator 30. Thus, the acceleration stage 10 may deliver an accelerating voltage totaling four times the maximum amplitude of the RF voltage output by the resonator 30, accounting for the maximum voltage that will develop between a first ground electrode 26 and the first RF electrode 22, and the maximum voltage that will develop between a second ground electrode 28 and the second RF electrode 24.

Note that in the configuration of FIG. 1A and FIG. 1B, the resonator 30 is arranged to mechanically support an RF electrode of the electrode assembly 20, in this case, first RF electrode 22 and second RF electrode 24. In particular, the conductive base 38 is arranged to support the resonator coil 32, and in turn, resonator coil 32 will support first the first RF electrode 22 and second RF electrode 24, via the first terminal 34 and second terminal 36, respectively. For example, the first terminal 34 and second terminal 36 may be rigid metallic pieces that are in turn rigidly fixed to the main portion 40 of the resonator coil 32. Thus, the conductive base 38 will stabilize the first RF electrode 22 and second RF electrode 24 from movement.

Moreover, according to various embodiments of the disclosure, the conductive base 38 will be movable along at least one axis or direction, so as to adjust a position of the resonator coil 32. Because the RF drift tubes of the electrode assembly 20 are rigidly connected to the resonator coil 32, this adjustment of the resonator coil 32 will also adjust the position of the RF drift tubes, which adjustment may aid in overall alignment of RF drift tubes in the electrode assembly 20. In one example, the conductive base 38 may include adjustments (not separately shown) to allow translation or independent movement along the x-y-, and z axes of the Cartesian coordinate system shown.

Note that in the embodiment of FIG. 1A and FIG. 1B, the resonator 30 may be constructed entirely of conductive parts, wherein no dielectric or insulator surfaces are in contact with any RF surfaces that are disposed on the high voltage end 18 of the resonator coil 32. Said differently, in the embodiment of FIG. 1A and FIG. 1B, no insulator material touches the resonator coil 32 or electrode assembly 20 on any surface.

As such, the resonator chamber 12 may operate more stably than known resonators, where insulator structures may be present within a vacuum enclosure where high voltage is present.

In the particular embodiment of FIG. 1A and FIG. 1B the first part of the resonator coil 32, meaning the main portion 40, has a tubular shape, arranged with a first width, while the second part of the resonator coil 32, meaning the first terminal 34 and second terminal 36, have a different structure than the first part. In particular, the first terminal 34 and the second terminal 36 each couple to the resonator coil 32 on a first end, and each couple to a respective RF electrode of the electrode assembly 20, on a second end. The first terminal 34 and the second terminal 36 may each have a smaller width than the width (or diameter) of the main portion 40 of the resonator coil 32. In order to dissipate heat generated by the power delivered by resonator coil 32, which power may equal 10,000 W or more, the main portion 40 of the resonator coil 32 may have a hollow structure to conduct a cooling fluid therein, such as water. As such, the diameter of the main portion 40 of the resonator coil 32 may be several centimeters and in particular between 3 cm and 8 cm according to some non-limiting embodiments.

Figure 2:
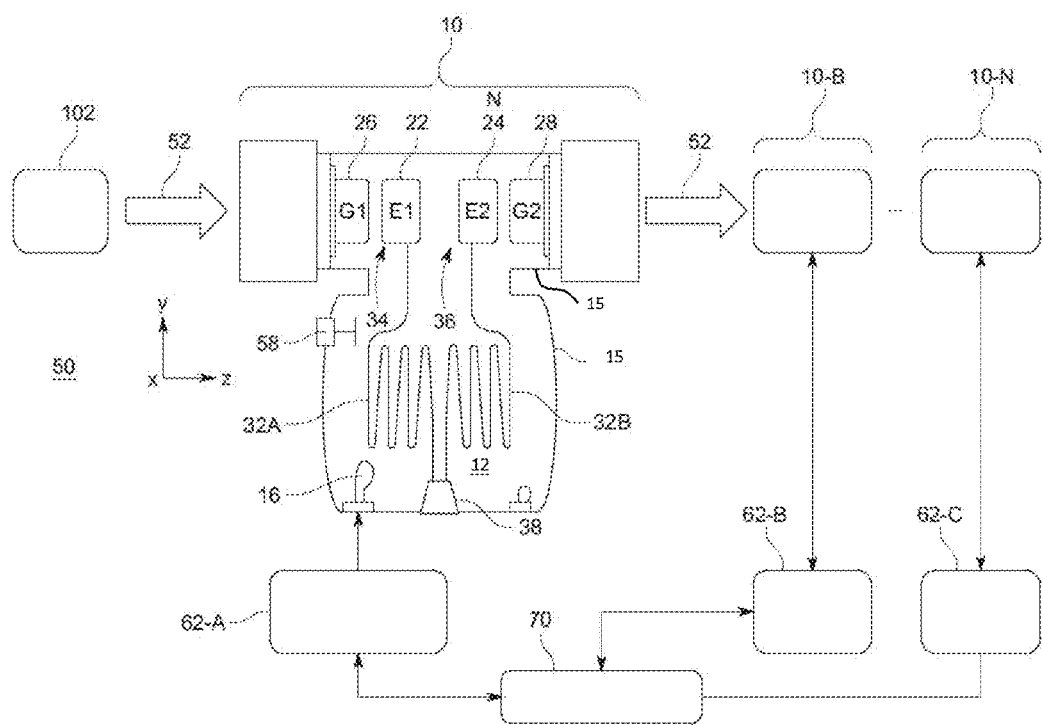
FIG. 2 shows an exemplary linear accelerator design in a beamline of ion implanter, according to embodiments of the disclosure.

FIG. 2 shows an exemplary linear accelerator, shown as linear accelerator 50, in a beamline of ion implanter, according to embodiments of the disclosure. The linear accelerator 50 includes a plurality of acceleration stages, shown as acceleration stage 10, acceleration stage 10-B, acceleration stage 10-N. Each of the stages shown may be arranged generally as in the embodiments of FIG. 1A and FIG. 1B. Each acceleration stage may be powered by a dedicated RF source, shown as RF source 62-A, RF source 62-B, and RF source 62-C, where the operation of the RF sources may further be controlled by a controller 70. As such, each acceleration stage may be arranged with a resonator chamber 12 that has no insulator surfaces in contact with RF voltage. This feature allows each resonator coil 32 to be driven with a relatively higher voltage without causing reliability problems that may arise from breakdown or other damage to insulator surfaces exposed to high voltage. Thus, assuming a triple gap configuration as depicted, assuming a maximum RF voltage amplitude of 300 kV, in one example, and assuming the ions of an ion beam 52 are synchronized to arrive at respective gaps between the electrodes of electrode assembly 20 at maximum voltage, each acceleration stage may accelerate a singly charged ion up to 1.2 MeV. Accordingly, the linear accelerator 50 may accelerate an ion beam 52 by up to 1.2 n MeV, where n is the number of acceleration stages.

Figure 3:
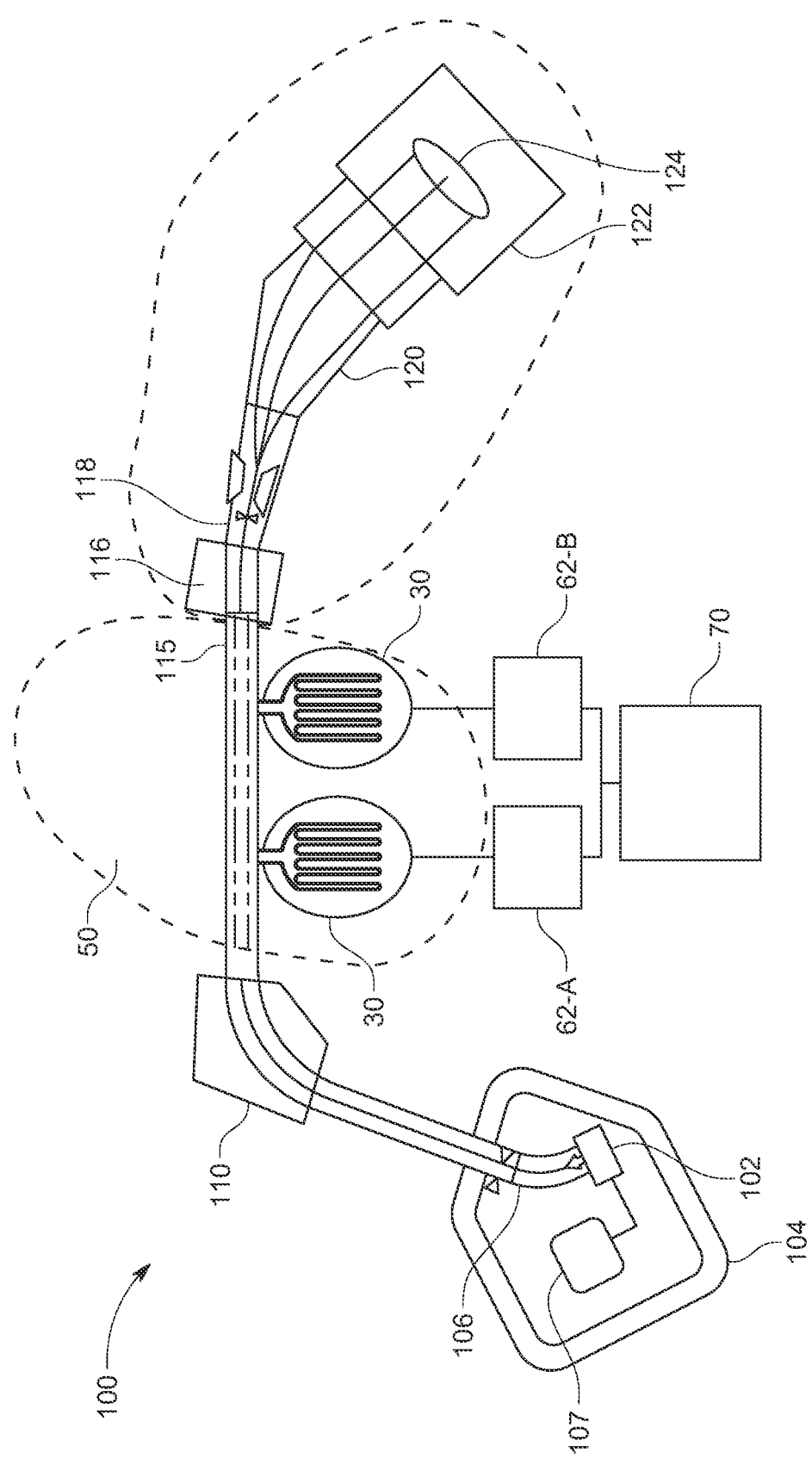
FIG. 3 depicts an exemplary ion implanter according to embodiments of the disclosure.

FIG. 3 depicts an exemplary system, shown as ion implanter 100 in block form according to embodiments of the disclosure. The ion implanter 100 may represent a beamline ion implanter, with some elements omitted for clarity of explanation. The ion implanter 100 may include an ion source 102, and a gas box 107 held at high voltage as known in the art. The ion source 102 may include extraction components and filters (not shown) to generate an ion beam 106 at a first energy. Examples of suitable ion energy for the first ion energy range from 5 keV to 100 keV, while the embodiments are not limited in this context. To form a high energy ion beam, the ion implanter 100 includes various additional components for accelerating the ion beam 106.

The ion implanter 100 may include an analyzer 110, functioning to analyze a received ion beam. Thus, in some embodiments, the analyzer 110 may receive the ion beam 106 with an energy imparted by extraction optics located at the ion source 102, where the ion energy is in the range of 100 keV or below, and in particular, 80 keV or below. In other embodiments, the analyzer 110 may receive the ion beam accelerated by a DC accelerator column to higher energies such as 200 keV, 250 keV, 300 keV, 400 keV, or 500 keV. The embodiments are not limited in this context. The ion implanter 100 may also include a linear accelerator 50 (shown in the dashed line), disposed downstream of the analyzer 110. The linear accelerator 50 may include a plurality of accelerator stages, arranged in series, as represented by resonators 30, as discussed above. For example, a given stage of the linear accelerator may be driven by a given resonator, generating an AC voltage signal in the MHz range (RF range), where the AC voltage signal generates an AC field at an electrode of the given stage. The AC field acts to accelerate the ion beam, which beam may be delivered to the stages in packets as a bunched ion beam. A buncher, not separately shown, may be located upstream of the linear accelerator 50 or may be located at a first stage of the linear accelerator 50, to receive a continuous ion beam and generate a bunched ion beam by action of an RF resonator at the buncher. The accelerator stages may act similarly to the buncher, to output bunched ion beams at a given stage, and to accelerate the ion beam to a higher energy in stages. Thus, a buncher may be considered to be a first accelerator stage, differing from downstream accelerator stages in that the ion beam is received as a continuous ion beam in the buncher.

In various embodiments, the ion implanter 100 may include additional components, such as a filter magnet 116, a scanner 118 and collimator 120, where the general functions of the filter magnet 116, scanner 118 and collimator 120 are well known and will not be described herein in further detail. As such, a high energy ion beam, represented by the high energy ion beam 115, after acceleration by the linear accelerator 50, may be delivered to an end station 122 for processing of a substrate 124. In various embodiments, a given acceleration stage of the acceleration stages 10 to 10N may be coupled to or may include a controller 70, as described above.

FIG. 4 depicts a side view another exemplary acceleration stage for a linear accelerator, according to embodiments of the disclosure. In this case the acceleration stage 200 includes an electrode assembly 220 that is arranged as a double gap configuration, having just one RF electrode shown as RF electrode 222, a first ground electrode 224, and a second ground electrode 226. As such, two acceleration gaps, G1 and G2 are formed. The resonator 210 has a resonator chamber 212 that contains a resonator coil 214, formed of a single coil, and attached on a low voltage side to a conductive base 216, and on a high voltage side 218, to the RF electrode 222. In this example, the resonator coil 214, and conductive base 216 may be arranged similarly to the previous embodiments to mechanically support the RF electrode 222, such that no insulator surfaces are present in contact with high voltage in the resonator chamber 212.

In view of the foregoing, at least the following advantages are achieved by the embodiments disclosed herein. A first advantage is that, since no insulator surfaces may be present in the high voltage region of a resonator chamber, dielectric breakdown may be avoided. A second advantage is that since dielectric is not present to be coated by conductive beam material, failure by such coating formation is precluded.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:
1. An apparatus, comprising:
a resonator chamber, arranged in a vacuum enclosure;
an RF electrode assembly, arranged within the vacuum enclosure; and
a resonator coil, disposed within the resonator chamber, the resonator coil having a high voltage end, directly connected to at least one RF electrode of the RF electrode assembly.

2. The apparatus of claim 1, the resonator coil arranged to mechanically support the at least one RF electrode.

3. The apparatus of claim 1, the resonator coil comprising:
a first coil, the first coil being connected to a first RF electrode of the RF electrode assembly, and
a second coil, the second coil being connected to a second RF electrode of the RF electrode assembly.

4. The apparatus of claim 1, further comprising a conductive base, disposed upon a ground end of the resonator coil, wherein the conductive base is movable along at least one axis, so as to adjust a position of the resonator coil with respect to the at least one RF electrode.

5. The apparatus of claim 4, wherein the conductive base is independently movable along three different axes.

6. The apparatus of claim 1, wherein the resonator coil comprises:
a first part, having a tubular shape, arranged with a first width; and
a second part, connected to the first part on a first end, and connected to an electrode of the RF electrode assembly on a second end.

7. The apparatus of claim 1, wherein no insulator material is in contact with any surface of the resonator coil or the RF electrode assembly.

8. A linear accelerator, comprising:
a plurality of acceleration stages, wherein a give stage of the plurality of acceleration stages comprises:
a resonator chamber, arranged in a vacuum enclosure;
an RF electrode assembly, arranged within the vacuum enclosure; and
a resonator coil, disposed within the resonator chamber, the resonator coil having a distal end, directly connected to at least one RF electrode of the RF electrode assembly.

9. The linear accelerator of claim 8, the resonator coil arranged to mechanically support the at least one RF electrode.

10. The linear accelerator of claim 8, the resonator coil comprising:
a first coil, the first coil being connected to a first RF electrode of the RF electrode assembly, and
a second coil, the second coil being connected to a second RF electrode of the RF electrode assembly.

11. The linear accelerator of claim 8, the resonator chamber further including a conductive base, disposed upon a ground end of the resonator coil, wherein the conductive base is movable along at least one axis, so as to adjust a position of the resonator coil with respect to the at least one RF electrode.

12. The linear accelerator of claim 11, wherein the conductive base is independently movable along three different axes.

13. The linear accelerator of claim 8, wherein the resonator coil comprises: a first part, having a tubular shape, arranged with a first width; and a second part, connected to the first part on a first end, and connected to an electrode of the RF electrode assembly on a second end.

14. The linear accelerator of claim 8, further comprising a buncher, disposed upstream of the plurality of acceleration stages, wherein the buncher comprises an electrode assembly and a resonator chamber that includes a resonator coil having a ground end and having a high voltage end that is directly connected to an electrode of the electrode assembly, wherein the resonator coil supports the electrode.

15. An ion implanter, comprising:
an ion source to generate an ion beam; and
a linear accelerator, including at least one acceleration stage to accelerate the ion beam, wherein the at least one acceleration stage comprises:
a vacuum enclosure, the vacuum enclosure housing an RF electrode assembly and a resonator coil, the resonator coil having a distal end, directly connected to at least one RF electrode of the RF electrode assembly, wherein no insulator material is in contact with any surface of the resonator coil or the RF electrode assembly.

16. The ion implanter of claim 15, the resonator coil arranged to mechanically support the at least one RF electrode.

17. The ion implanter of claim 15, the resonator coil comprising:
a first coil, the first coil being connected to a first RF electrode of the RF electrode assembly, and
a second coil, the second coil being connected to a second RF electrode of the RF electrode assembly.

18. The ion implanter of claim 15, the vacuum enclosure further including a conductive base, disposed upon a ground end of the resonator coil, wherein the conductive base is movable along at least one axis, so as to adjust a position of the resonator coil with respect to the at least one RF electrode.

19. The ion implanter of claim 15, wherein the resonator coil comprises: a first part, having a tubular shape, arranged with a first width; and
a second part, connected to the first part on a first end, and connected to an electrode of the RF electrode assembly on a second end.

20. The ion implanter of claim 15, further comprising a buncher, disposed upstream of the at least one acceleration stage, wherein the buncher comprises an electrode assembly and a resonator chamber that includes a resonator coil having a ground end and having a high voltage end that is directly connected to an electrode of the electrode assembly, wherein the resonator coil supports the electrode.

* * * * *